(12) United States Patent
Mitsugi et al.

(10) Patent No.: US 8,173,523 B2
(45) Date of Patent: May 8, 2012

(54) METHOD OF REMOVING HEAVY METAL IN SEMICONDUCTOR SUBSTRATE

(75) Inventors: Noritomo Mitsugi, Tokyo (JP); Masataka Hourai, Tokyo (JP); Shuichi Samata, Tokyo (JP); Kiyoshi Nagai, Tokyo (JP); Kei Matsumoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/899,338

(22) Filed: Oct. 6, 2010

(65) Prior Publication Data

US 2011/0086494 A1 Apr. 14, 2011

(30) Foreign Application Priority Data

Oct. 9, 2009 (JP) ................................. 2009-235340

(51) Int. Cl.
*H01L 21/322* (2006.01)
(52) U.S. Cl. ........ 438/476; 438/473; 438/692; 438/715; 438/720; 438/742; 257/E21.318
(58) Field of Classification Search .................. 438/459, 438/674, 678, 680, 692, 715, 720, 742, 473, 438/476, FOR. 144
See application file for complete search history.

(56) References Cited

U.S. PATENT DOCUMENTS

| 3,808,031 | A | * | 4/1974 | Brill-Edwards | 427/252 |
| 4,716,081 | A | * | 12/1987 | Ehrreich | 428/403 |
| 6,059,637 | A | * | 5/2000 | Pasch et al. | 451/41 |
| 6,830,991 | B2 | * | 12/2004 | Saino | 438/476 |
| 2002/0025671 | A1 | * | 2/2002 | Pyo | 438/638 |
| 2003/0017682 | A1 | * | 1/2003 | Saino | 438/476 |
| 2004/0001966 | A1 | * | 1/2004 | Subramanian et al. | 428/679 |
| 2006/0211170 | A1 | * | 9/2006 | Oyu et al. | 438/106 |
| 2007/0069177 | A1 | * | 3/2007 | Peters et al. | 252/182.1 |
| 2007/0207616 | A1 | * | 9/2007 | Hirano et al. | 438/692 |
| 2008/0124924 | A1 | * | 5/2008 | Naik | 438/675 |

FOREIGN PATENT DOCUMENTS

| JP | 08-162406 | 6/1996 |
| KR | 2008-0061381 A | 7/2008 |

OTHER PUBLICATIONS

Korean Office Action issued Aug. 26, 2011 for Application No. 10-2010-0098363.

* cited by examiner

*Primary Examiner* — Michelle Mandala
(74) *Attorney, Agent, or Firm* — Nutter McClennen & Fish LLP; Thomas J. Engellenner

(57) ABSTRACT

To provide a method of removing a heavy metal contained in a thinned semiconductor substrate.

A method of removing a heavy metal in a semiconductor substrate of the present invention comprises: attaching, to a rear surface of the semiconductor substrate, a material that lowers a potential barrier of the rear surface of the semiconductor substrate, on a front surface of which a circuit is to be formed or is formed; applying a thermal treatment to the semiconductor substrate under a condition based on a thickness and a resistivity of the semiconductor substrate; and, depositing the heavy metal in the semiconductor substrate on the rear surface.

7 Claims, 4 Drawing Sheets

METHOD OF REMOVING HEAVY METAL IN SEMICONDUCTOR SUBSTRATE

BACKGROUND OF THE INVENTION

1. Field of the Invention

The present invention relates to a method of removing a heavy metal contained in a semiconductor substrate thinned by a polishing-process.

2. Description of the Related Art

In a manufacturing process of LSI devices, various thermal treatments are applied in various steps depending on configurations of devices. If copper, iron, nickel, chromium or other heavy metal contaminations exist in a semiconductor substrate to be used in the device manufacturing, defects are formed or electric levels are changed in the vicinity of a front surface of the semiconductor substrate in the thermal treatment process, whereby device properties may deteriorate. For this reason, prior to the device manufacturing process, it is necessary to remove these heavy metal elements from the vicinity of the front surface of the semiconductor substrate, where the device is to be formed. Therefore, in manufacturing of the semiconductor devices, gettering techniques have been widely used in which the heavy metal contamination matters intruding into the semiconductor substrate are captured in a portion other than the active region on the front surface side of the semiconductor substrate, whereby deterioration in the device properties can be prevented even if the metal contamination occurs.

The gettering technique is roughly divided into an extrinsic gettering method in which a gettering site for capturing the heavy metal elements is formed on a rear surface of the semiconductor substrate, and an intrinsic gettering method in which the gettering site for capturing the heavy metal elements is formed in the semiconductor substrate.

Of the two methods, the intrinsic gettering method having a high gettering capability is more widely used for gettering the impurities (for example, see JP-08-162406 Laid-Open).

Incidentally, in recent years, it has been demanded that the thickness of the semiconductor substrate be 100 µm or lower due to the miniaturization and reduction in weight of the electronic devices. Accordingly, after the device is formed on the front surface of the semiconductor substrate, the semiconductor substrate is ground from the rear surface side so as to be thinner, such that the thickness thereof is 100 µm or lower. Particularly, after the year 2010, the thickness of the semiconductor substrate is expected to be about 10 µm.

SUMMARY OF THE INVENTION

Even if the gettering site is formed in the semiconductor substrate by using the intrinsic gettering method to prevent the metal contamination, when the semiconductor substrate is polished (for example, by chemical-mechanical polishing: CMP) to be made thinner, the gettering site is also ground along with the semiconductor substrate, which may lead to a case where the heavy metal elements cannot be captured in the semiconductor substrate. Additionally, with the polishing process stated above, which is essential to make the substrate thin, there arises a problem that the heavy metal elements contained in the polishing slurry are incorporated into the semiconductor substrate in a form of positive ion, and becomes new contamination metals.

In view of the circumstances described above, an object of the present invention is to solve the problems as described above and to provide a method of removing the heavy metal contained in the thinned semiconductor substrate.

The summary of the present invention is as follows.

(1) A method of removing a heavy metal in a semiconductor substrate comprising:

attaching, to a rear surface of the semiconductor substrate, a material that lowers a potential barrier of the rear surface of the semiconductor substrate, on a front surface of which a circuit is to be formed or is formed;

applying a thermal treatment to the semiconductor substrate under a condition based on a thickness and a resistivity of the semiconductor substrate; and, depositing the heavy metal in the semiconductor substrate on the rear surface.

(2) The method of removing a heavy metal in a semiconductor substrate according to (1) above, wherein the thickness of the semiconductor substrate is 100 µm or below.

(3) The method of removing a heavy metal in a semiconductor substrate according to (1) or (2) above, wherein the material that lowers the potential barrier of the rear surface is at least one material selected from a material that lowers surface state density of the rear surface, a material that negatively charges the rear surface, and a material having a higher solid solubility than that of the semiconductor substrate.

(4) The method of removing a heavy metal in a semiconductor substrate according to (3) above, wherein the material that lowers the surface state density of the rear surface contains a cyanide ion.

(5) The method of removing a heavy metal in a semiconductor substrate according to (3) above, wherein the material that negatively charges the rear surface contains an organic matter.

(6) The method of removing a heavy metal in a semiconductor substrate according to (3), wherein the material having a higher solid solubility than that of the semiconductor substrate contains aluminum.

According to the present invention, by attaching a material that lowers a potential barrier of a rear surface of a thinned semiconductor substrate to the rear surface and by applying an appropriate thermal treatment, a heavy metal contained in the semiconductor substrate can be reliably removed.

DESCRIPTION OF THE PREFERRED EMBODIMENTS

Figure 1:
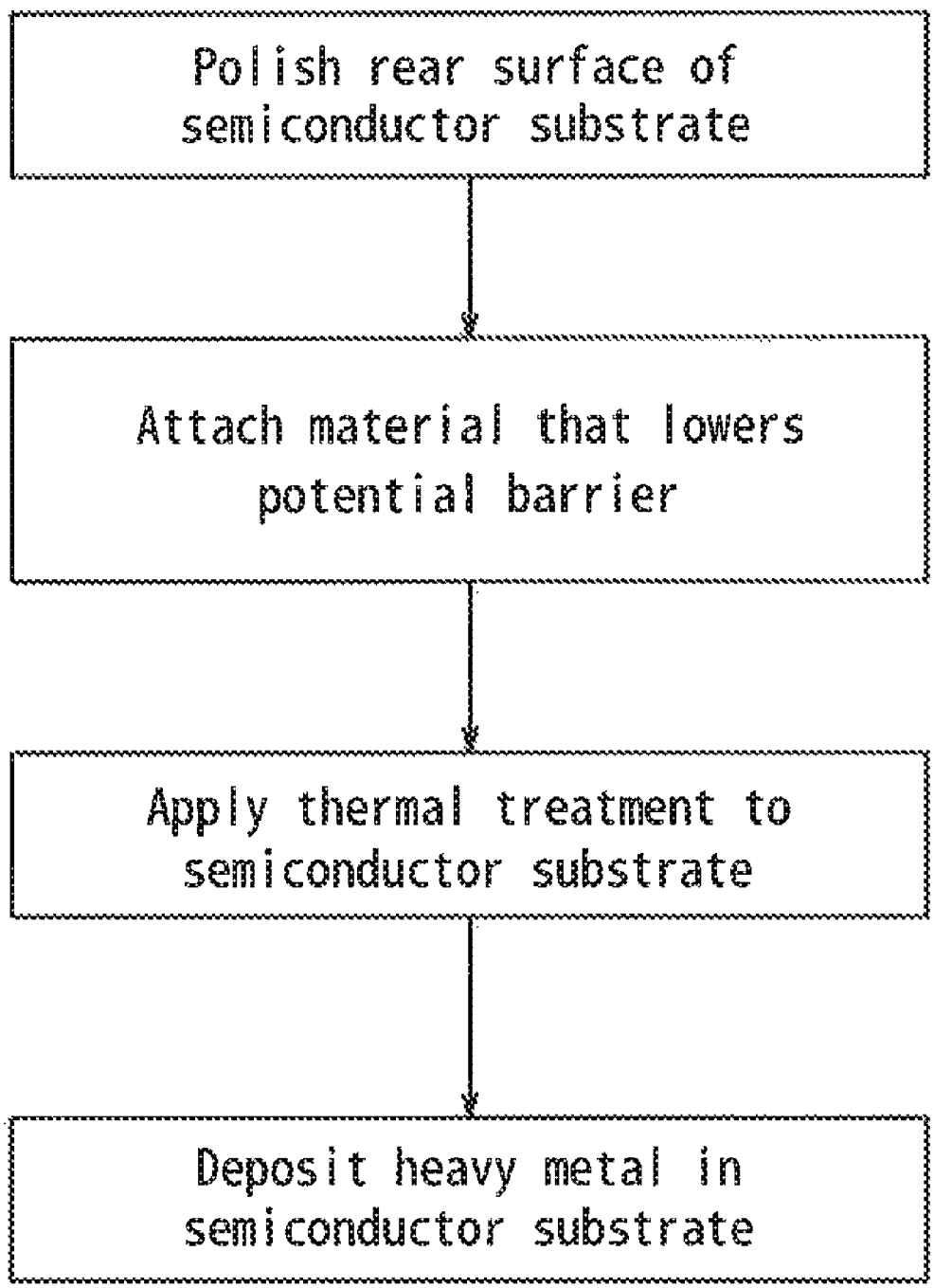
FIG. 1 is a flow sheet illustrating a method of removing a heavy metal in a semiconductor substrate, according to the present invention.

FIG. 1 is a flow sheet illustrating a method of removing a heavy metal in a semiconductor substrate, according to the present invention.

First, a polishing process (including grinding process) such as chemical-mechanical polishing (CMP) is applied to a rear surface of a semiconductor substrate, on a front surface side of which a circuit is to be formed or is formed. Next, a material that lowers a potential barrier of the rear surface of the semiconductor substrate is attached to the rear surface of the semiconductor substrate. Then, a thermal treatment is applied to the semiconductor substrate to deposit the heavy metal existing in the semiconductor substrate, on the rear surface of the semiconductor substrate.

Hereinafter, each process will be described, in detail.

When the polishing process is applied to the rear surface of the semiconductor substrate, on the front surface side of which the circuit into be formed or is formed, the heavy metal (for example, copper) contained in the slurry is incorporated into the semiconductor substrate from the rear surface of the semiconductor substrate, and becomes contamination metal in the form of positive ion. The heavy metal incorporated into the semiconductor substrate moves in the semiconductor substrate by diffusion phenomenon. As a result of such movement, there may occur a case where the heavy metal reaches the front surface of the semiconductor substrate where the circuit is to be formed or is formed, and is deposited on the front surface of the semiconductor substrate. This deposited matter, if deposited before the formation of the circuit, can be removed by cleaning the front surface of the semiconductor substrate. However, the deposited matter, if deposited on the front surface after the formation of the circuit, cannot be removed and may have an adverse effect on the operation properties of the device. Furthermore, if the heavy metal is not deposited and remains in the active layer after the formation of the circuit, there arises a problem that the device properties are deteriorated. Therefore, it is necessary to remove the heavy metal contained in the substrate. Especially, after the circuit is formed on the front surface of the semiconductor substrate, it is necessary to deposit the contamination metal on the rear surface of the semiconductor substrate, on which the circuit has not been formed so as to remove thus-deposited contamination metal.

However, a deposition reaction of the heavy metal positively ionized in the semiconductor substrate is inhibited by a potential barrier existing in the rear surface of the semiconductor substrate. Therefore, first, it is important to remove this potential barrier. To this end, it is important to apply the appropriate thermal treatment after a material that lowers the potential barrier is attached. As a result of earnest studies, the inventors reached the idea that it is effective to attach a material that lowers the potential barrier to the rear surface of the semiconductor substrate to remove the potential barrier, and more specifically, it is effective to attach the following three materials. That is, (1) a material that lowers surface state density of the rear surface of the semiconductor substrate is attached to the rear surface, (2) a material that negatively charges the rear surface of the semiconductor substrate is attached to the rear surface, and (3) a material that has a higher solid solubility than the semiconductor substrate is attached to the rear surface.

Hereinafter, the potential barrier will be described and then each of the above-mentioned materials (1) to (3) will be described.

The heavy metal in the semiconductor substrate is diffused through the thermal treatment and is deposited to the outside of the semiconductor substrate. However, the amount of the deposition is smaller than the amount of deposition estimated on the basis of the diffusion constant of the heavy metal in the semiconductor substrate. This is because, in the vicinity of the surface of the semiconductor substrate, there exists a certain diffusion barrier that inhibits the diffusion and the deposition, that is, a potential barrier.

Especially, in a p-type semiconductor substrate, it is highly probable that the metal such as copper, which is solid-solved in the substrate, exists as a positive ion. On the surface of the clean p-type semiconductor substrate, a depleted layer is formed, and curvature of electron potential (band bending) occurs. This curvature of the electron potential serves as the barrier for the positively ionized metal atoms, and hence, it is necessary to overcome the barrier of the electron potential when the positive ion in the p-type semiconductor substrate is deposited on the surface of the p-type semiconductor substrate by the thermal diffusion. Therefore, to enhance the deposition of the positive ion on the surface, it is necessary to lower the barrier of the electron potential.

To lower the surface state density of the rear surface of the semiconductor substrate, cyanide ion $CN^-$ is attached to the rear surface of the semiconductor substrate. More specifically, the rear surface of the semiconductor substrate is exposed to cyanide ion $CN^-$, or the semiconductor substrate is immersed into the cyanide compound solution containing the cyanide ion $CN^-$. It is believed that, after the attachment, the cyanide ion $CN^-$ having a strong binding force is bound with the dangling bond (unpaired electron) existing in the rear surface of the semiconductor substrate, and makes the dangling bond electrically inactive, whereby the surface state density of the rear surface of the semiconductor substrate is lowered. As a result, the potential barrier of the rear surface of the semiconductor substrate can be lowered.

The cyanide compound includes, for example, sodium cyanide, potassium cyanide, hydrogen cyanide, and dicyanogen.

To negatively charge the rear surface of the semiconductor substrate, an organic matter is attached to the rear surface of the semiconductor substrate, and, more specifically, the semiconductor substrate is accommodated in a wafer case containing, for example, amine as a degassing component. By heating the wafer case, degassing from the wafer case is promoted, and the degassing component in the wafer case is attached to the rear surface of the semiconductor substrate. This makes the rear surface of the semiconductor substrate negatively charged. As a result, the electrification of the rear surface of the semiconductor substrate, which serves as the potential barrier against the deposition reaction, is cancelled, and the potential barrier of the rear surface of the semiconductor substrate can be lowered.

By applying the thermal treatment to the semiconductor substrate while the rear surface thereof is being brought into contact with a solid material (for example, aluminum, silver, chromium) having a higher solid solubility for the heavy metal than that of the semiconductor substrate, the heavy metal can be moved from the inside of the semiconductor substrate to the inside of the solid material. It is believed that utilizing the solid solution reaction toward the material having the higher solid solubility has substantially the same effect as lowering the potential barrier of the deposition reaction. Additionally, it is believed that this solid solution reaction easily occurs (the activation energy is lower) as compared with the above-mentioned deposition on the surface. This is because the difference in the solid solubility functions as the driving force of the reaction, and the heavy metal is moved from the lower solid solubility to the higher solid solubility. Furthermore, a chemical reaction of positive ion (metalization or bonding with oxygen) also occurs along with the deposition reaction. This is because, in the solid solution reaction, positive ion is directly diffused to the material having a high solid solubility.

Here, in the thermal treatment applied to the semiconductor substrate having the material that lowers the potential barrier attached thereto, the heavy metal in the semiconductor substrate is first diffused to the rear surface of the semiconductor substrate, and hence, it is preferable that a temperature and time are determined on the basis of the thickness and resistivity of the semiconductor substrate. That is, by using diffusion coefficient D ($cm^2 \cdot s^{-1}$) and thermal treatment time t (s), diffusion length L (cm) of metal in the semiconductor substrate is expressed by the following relational expression (I).

$$L=\sqrt{Dt} \quad (I)$$

In the expression (I) above, the diffusion coefficient D depends on the thermal treatment temperature and the resistivity of the semiconductor substrate (see A. A. Istratov et. al., Phys. Rev. Lett. Vol. 81 (1998) p. 1243). Therefore, as a condition for diffusing the metal in the semiconductor substrate to the rear surface, the time and the temperature for the thermal treatment can be determined on the basis of the thickness (that is, diffusion length of the metal in the semiconductor substrate) of the semiconductor substrate and the resistivity of the semiconductor substrate. For example, Table 1 shows the thermal treatment temperature and the thermal treatment time for delivering, to the rear surface, most of copper contained in a semiconductor substrate 1 ($p^-$ substrate, resistivity of 13 mΩcm) and a semiconductor substrate 2 ($p^+$ substrate, resistivity of 2.2 mΩcm), each of the substrates 1 and 2 having a thickness of 100 μm. In Table 1, the diffusion period of time for which the diffusion length L is equal to the thickness (100 μm) of the substrate is indicated, by using the diffusion coefficient D (at each thermal treatment temperature) of copper in the p-type semiconductor substrate. In other words, by applying the thermal treatment on the basis of the time and the temperature shown in Table 1, most of copper in the semiconductor substrate reaches the rear surface to be deposited through the potential barrier lowering material. Therefore, the temperature and the time for the thermal treatment are selected and determined as appropriate from the relationship between the time and the temperature for the thermal treatment obtained on the basis of the thickness and the resistivity of the semiconductor substrate, for example, as shown in Table 1, and the thermal treatment is implemented. More specifically, the time and the temperature for applying the thermal treatment can be determined from the time and the temperature ranges for the thermal treatment obtained on the basis of the thickness and the resistivity of the substrate, by taking into consideration the productivity (it is preferable to set high temperature and short period of time for increase in productivity) and defect of the circuit (in a case where the thermal treatment is applied to the semiconductor substrate, on the front surface of which a circuit is formed, the circuit may deteriorate by the high temperature treatment).

As described above, even if the metal in the semiconductor substrate is diffused to the rear surface, the deposition of the metal is actually inhibited after the metal reaches the rear surface due to the potential barrier of the rear surface of the semiconductor substrate. However, according to the present invention, the material that lowers the potential barrier is attached to the rear surface, whereby the deposition of copper can be promoted through this material.

For example, in a case where the thermal treatment at a temperature of 125 degrees Celsius is applied by using the semiconductor substrate ($p^+$ substrate, 7.5 mΩcm) having the thickness of 100 μm, it is possible to deposit about 90 percent of copper by applying the thermal treatment for 18 minutes while the material that lowers the potential barrier is being attached to the rear surface in accordance with the present invention.

Similarly, in a case where the thermal treatment at a temperature of 125 degrees Celsius is applied by using the semiconductor substrate ($p^+$ substrate, resistivity of 7.5 mΩcm) having the thickness of 725 μm (since copper is deposited on both sides of the semiconductor substrate, the actual necessary diffusion length is 362.5 μm), it is possible to deposit about 90 percent of copper by applying the thermal treatment for 4 hours while the material that lowers the potential barrier is being attached to the rear surface in accordance with the present invention.

TABLE 1

| | Thermal treatment time (sec.) | |
|---|---|---|
| Temperature (degree Celsius) | Semiconductor substrate 1 $p^-$ substrate (resistivity of 13 mΩcm) | Semiconductor substrate 2 $p^+$ substrate (resistivity of 2.2 mΩcm) |
| 100 | 94 | 202335 |
| 150 | 47 | 18963 |
| 200 | 28 | 2911 |
| 250 | 18 | 642 |
| 300 | 13 | 187 |
| 350 | 10 | 69 |
| 400 | 7 | 31 |

As the next step, a step of removing the contamination metal deposited on the rear surface of the semiconductor substrate, for example, a step of removing the contamination metal by etching may be provided as appropriate.

It should be noted that, in the description above, it is assumed that the thermal treatment, immediately before a packaging step, is applied to the semiconductor substrate while the material that lowers the potential barrier of the rear surface of the semiconductor substrate is being attached to the rear surface. However, as the thermal treatment described above, a thermal treatment during the packaging step may be utilized. That is, the above-mentioned material that lowers the potential barrier of the rear surface of the semiconductor substrate is attached to the rear surface of the substrate that has been thinned by polishing, and then the packaging step including the thermal treatment (about 400 degrees Celsius) is implemented, whereby the contamination metal in the semiconductor substrate can be deposited on the rear surface side where no circuit pattern exists. Alternatively, a similar effect can be expected by incorporating the above-mentioned material into a packaging material (mold resin or ceramic) and applying the packaging step.

EXAMPLES

Figure 2:
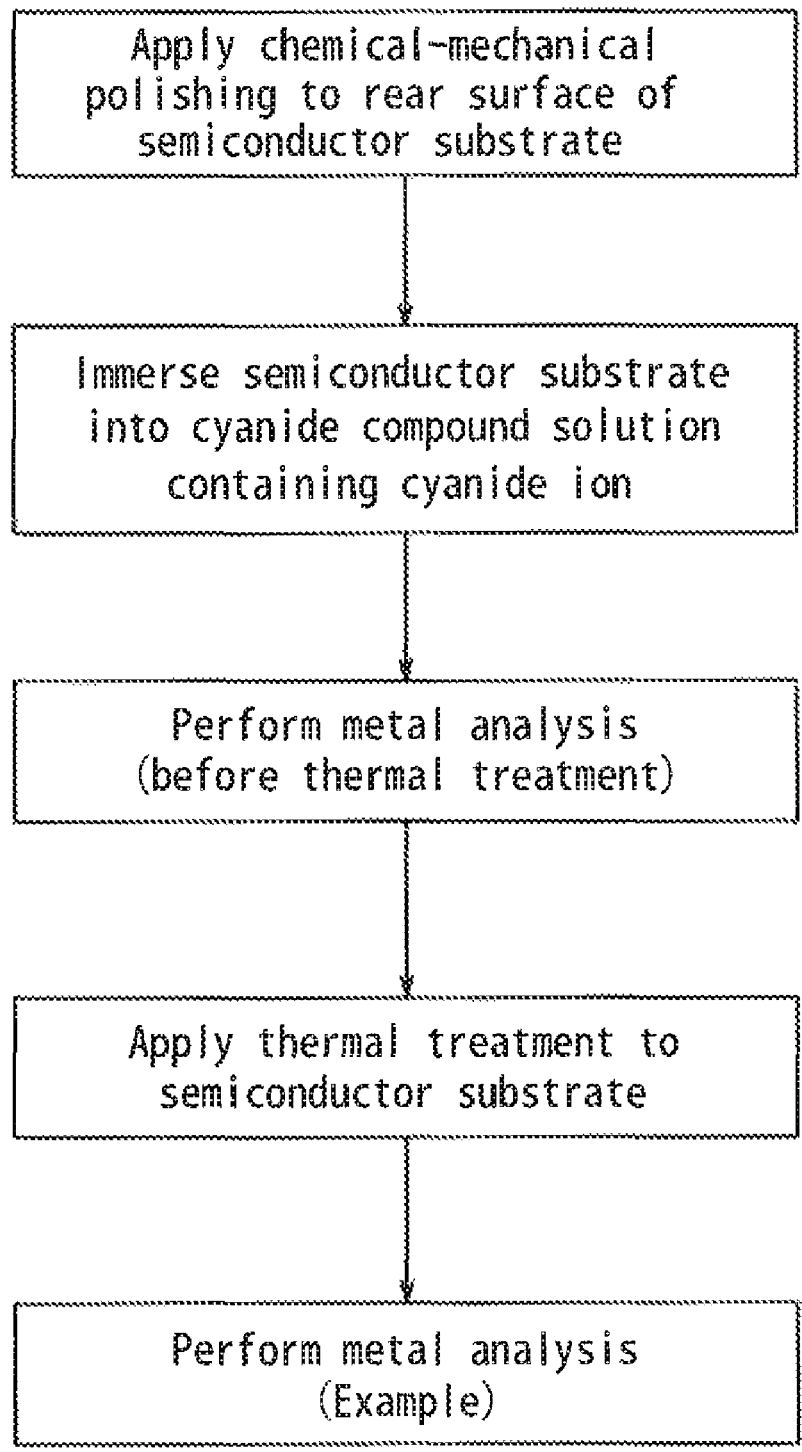
FIG. 2 is a flow sheet of Example.

In accordance with a flow sheet of Example shown in FIG. 2, the chemical-mechanical polishing is applied to the rear surface of the p-type semiconductor substrate ($p^+$ substrate, 200 mm in diameter, resistivity of 7.5 mΩcm) containing positively ionized copper in its inside. Next, the semiconductor substrate is immersed into the cyanide compound solution containing the cyanide ion $CN^-$ to lower the surface state density of the front and rear surfaces of the semiconductor substrate. Table 2 shows a result obtained by measuring a copper concentration of the front surface of the semiconductor substrate at this stage (before thermal treatment) by using the total reflection X-ray fluorescence analysis. Although the surface state density is lowered by adsorption of the cyanide ion, the surface deposition reaction of copper does not occur. Therefore, no copper exists on the front surface of the semiconductor substrate, and thus, all the results exhibit that copper is not detected (ND: Not detected). Next, by applying the thermal treatment (125 degrees Celsius, two hours, two times) to this semiconductor substrate, copper is deposited on the front and rear surfaces of the semiconductor substrate. Table 2 also shows a result of Example obtained by measuring the copper concentration of the front surface of the semiconductor substrate at this stage by using the total reflection X-ray fluorescence analysis.

Figure 3:
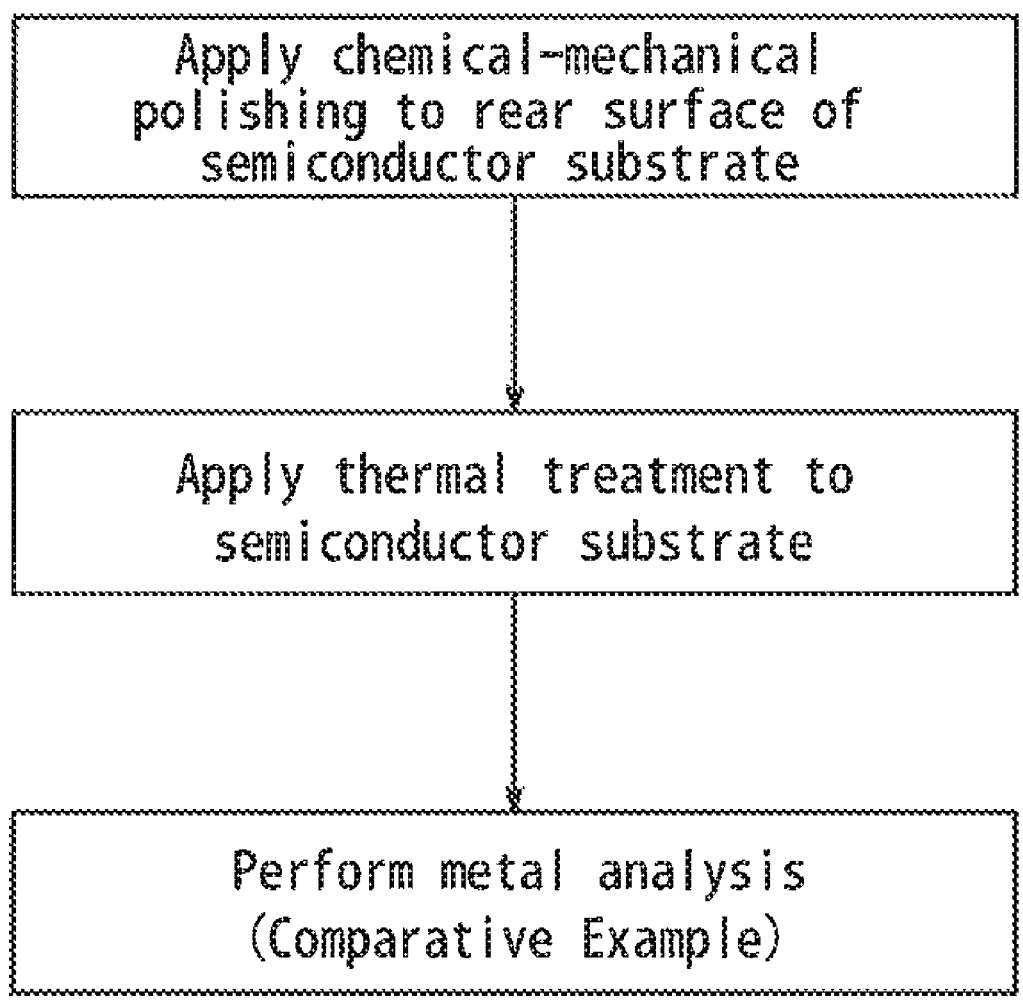
FIG. 3 is a flow sheet of Comparative Example.

Next, in accordance with a flow sheet of Comparative Example shown in FIG. 3, the thermal treatment (125 degrees Celsius, two hours, two times) is applied to the p-type semiconductor substrate containing positively ionized copper in its inside, and copper is deposited on the front and rear surfaces of the semiconductor substrate. Table 2 also shows a result of Comparative Example obtained by measuring the copper concentration on the front surface of the semiconductor substrate by using the total reflection X-ray fluorescence analysis.

Figure 4:
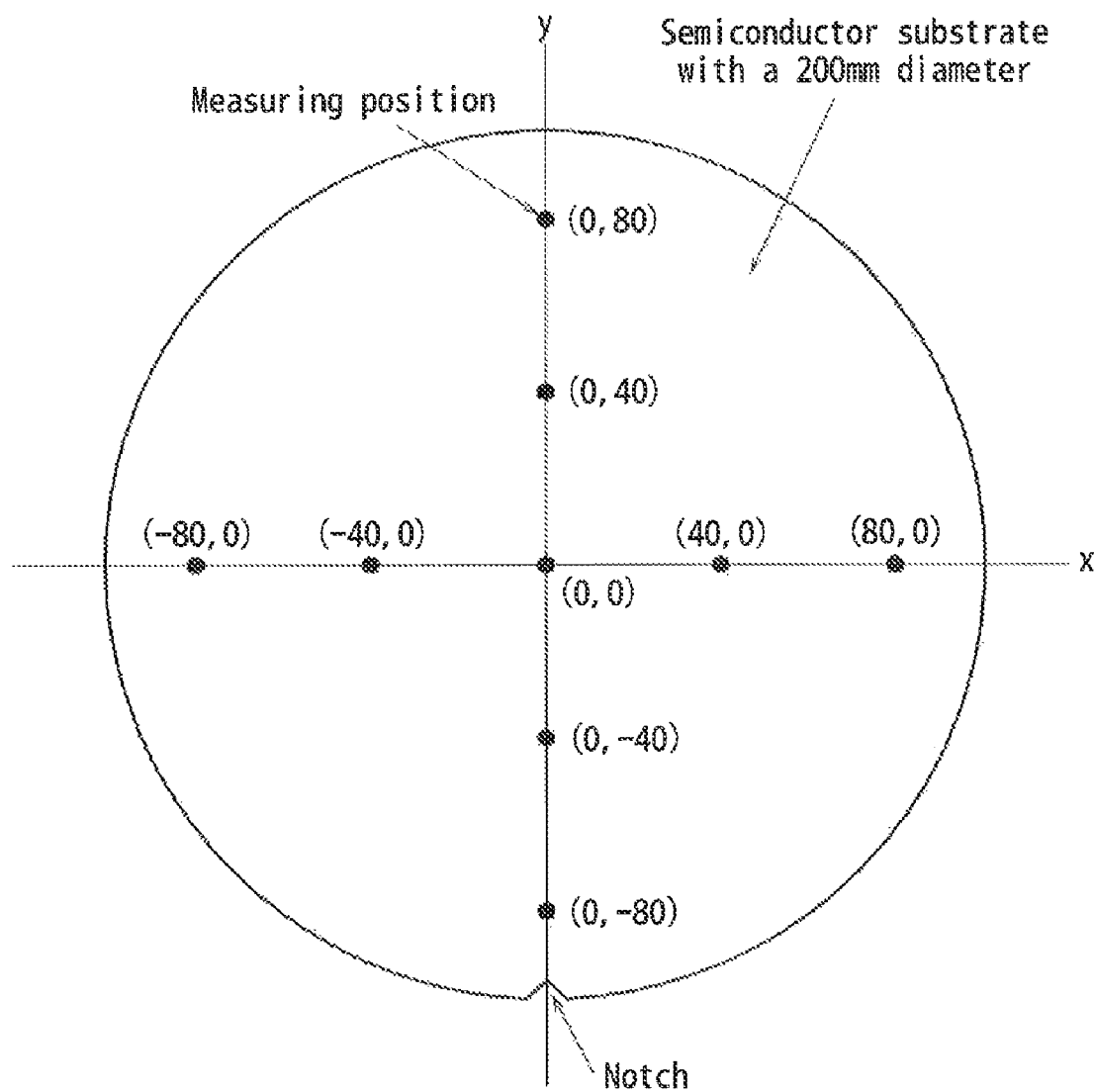
FIG. 4 is a diagram illustrating measuring positions for the copper concentration on the front surface of the semiconductor substrate according to EXAMPLES.

Measuring positions for the copper concentration on the front surface of the semiconductor substrate are illustrated in FIG. 4.

TABLE 2

| Measuring Position | Before thermal treatment [× $10^{10}$ atoms/cm$^2$] | Example [× $10^{10}$ atoms/cm$^2$] | Comparative Example [× $10^{10}$ atoms/cm$^2$] |
|---|---|---|---|
| (0, 0) | ND | 45.2 | 34.9 |
| (40, 0) | ND | 40.2 | 32.2 |
| (0, 40) | ND | 78.2 | 28.7 |
| (−40, 0) | ND | 62.9 | 33.5 |
| (0, −40) | ND | 48.9 | 27.4 |
| (80, 0) | ND | 18.5 | 22.7 |
| (0, 80) | ND | 30.7 | 16.8 |
| (−80, 0) | ND | 51.3 | 18.0 |
| (0, −80) | ND | 15.6 | 12.4 |
| Average | ND | 43.5 | 25.2 |

In each of the semiconductor substrates (p$^+$ substrate, resistivity of 7.5 mΩcm) of Example and Comparative Example, copper as the impurities is contained by about 100×$10^{10}$ atoms/cm$^2$ on a surface concentration basis (surface concentration in a case where all the inside impurities are deposited on the surface), after the rear surface of the semiconductor substrate is subjected to the chemical-mechanical polishing. Here, it is believed that copper on the front surface side with respect to a center in a thickness direction of the semiconductor substrate is likely to be deposited on the front surface, while copper on the rear surface side is likely to be deposited on the rear surface (substrate thickness after polishing: 725 µm).

In Example, of the copper of about 50×$10^{10}$ atoms/cm$^2$ contained in the front surface side, the copper of 43.5×$10^{10}$ atoms/cm$^2$ is deposited, and hence, it can be considered that most of the copper contained in the semiconductor substrate is deposited on the front and rear surfaces.

On the other hand, in Comparative Example, the average deposit amount is lower than that of Example, and about half of the copper remains in the semiconductor substrate. It is considered that this is because the surface deposition reaction of copper is inhibited as the surface state density exists in the front and rear surfaces of the semiconductor substrate of Comparative Example.

As described above, it can be found that the method according to the present invention has a high capability of depositing the copper incorporated in the p-type semiconductor substrate by the chemical-mechanical polishing.

What is claimed is:

1. A method of removing a heavy metal inside a semiconductor substrate comprising:
   providing a semiconductor substrate having a thickness of 100 µm or less;
   modifying a rear surface of the semiconductor substrate by exposing said rear surface to a material that lowers a potential barrier of the rear surface of the semiconductor substrate, on a front surface of which a circuit is to be formed or is formed; and
   applying a thermal treatment to the semiconductor substrate under a condition based on a thickness and a resistivity of the semiconductor substrate so as to diffuse the heavy metal inside the semiconductor substrate;
   wherein the diffused heavy metal inside the semiconductor substrate is precipitated on the rear surface of the semiconductor substrate.

2. The method of removing a heavy metal inside a semiconductor substrate according to claim 1, wherein
   the material that lowers the potential barrier of the rear surface is at least one material selected from a material that lowers surface state density of the rear surface and a material that negatively charges the rear surface.

3. The method of removing a heavy metal inside a semiconductor substrate according to claim 2, wherein
   the material that lowers the surface state density of the rear surface contains a cyanide ion.

4. The method of removing a heavy metal inside a semiconductor substrate according to claim 2, wherein
   the material that negatively charges the rear surface contains an organic matter.

5. A method of removing a heavy metal from inside a semiconductor substrate, comprising:
   providing a semiconductor substrate having a thickness of 100 µm or less;
   attaching to a rear surface of the semiconductor substrate a material having a higher solid solubility for the heavy metal than that of the semiconductor substrate; and
   applying a thermal treatment to the semiconductor substrate while the rear surface of the semiconductor substrate is in contact with the material so as to diffuse the heavy metal inside the semiconductor substrate;
   wherein, during the thermal treatment, the heavy metal moves from the inside of the semiconductor substrate to the inside of the material.

6. The method of removing a heavy metal from inside a semiconductor substrate according to claim 5, wherein the material having a higher solid solubility than that of the semiconductor substrate comprises a material selected from the group consisting of aluminum, silver, and chromium.

7. The method of removing a heavy metal form inside a semiconductor substrate according to claim 5, wherein the material comprises aluminum.

* * * * *